United States Patent [19]

Hayakawa et al.

[11] Patent Number: 4,745,682

[45] Date of Patent: May 24, 1988

[54] METHOD OF CONNECTING COIL

[75] Inventors: Tsuyoshi Hayakawa; Isato Watanabe; Satoru Yamauchi; Isao Kondo; Junichi Aizawa, all of Tokyo, Japan

[73] Assignee: Seikosha Co., Ltd., Tokyo, Japan

[21] Appl. No.: 37,465

[22] Filed: Apr. 13, 1987

[30] Foreign Application Priority Data

May 8, 1986 [JP] Japan ................... 61-105493

[51] Int. Cl.⁴ .............................................. H05K 3/39
[52] U.S. Cl. ....................................... 29/840; 361/400; 439/78
[58] Field of Search ................. 29/832, 834, 836, 840; 228/179; 336/200; 361/400, 401, 404, 406; 368/87, 88

[56] References Cited

U.S. PATENT DOCUMENTS 2,935,654  5/1960  Gittens et al. ............... 439/78 K
4,129,349  12/1978 Von Roesgen ................ 439/82

FOREIGN PATENT DOCUMENTS 1053050  3/1959  Fed. Rep. of Germany ...... 361/400

Primary Examiner—P. W. Echols
Assistant Examiner—Carl J. Arbes
Attorney, Agent, or Firm—Bruce L. Adams; Van C. Wilks

[57] ABSTRACT

A method of connecting a coil as mounted in an electric watch or clock in which a lead wire of the coil is made to cross a conductor near the terminal portion of the coil. The lead wire is drawn so as to traverse beyond a conductor to which it is to be attached, and the lead wire is anchored by an anchoring device so as to hold it against the conductor. The lead wire is then bonded to the conductor at the point of traverse.

7 Claims, 2 Drawing Sheets

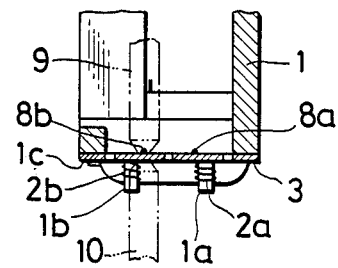
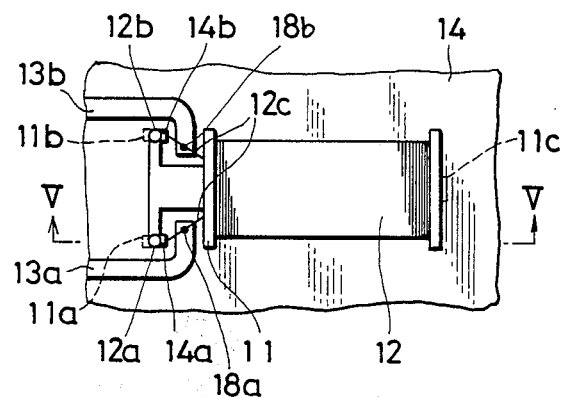
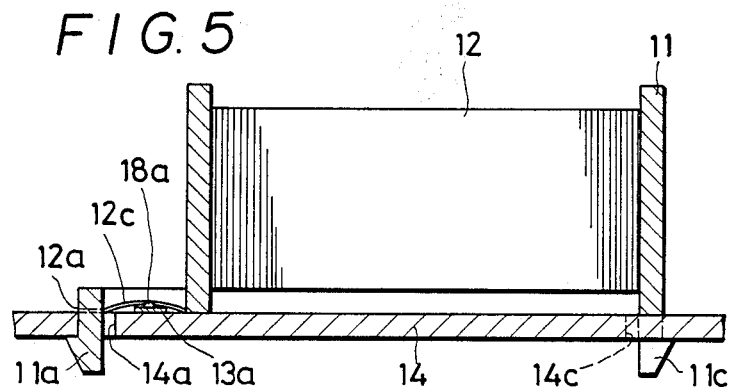

METHOD OF CONNECTING COIL

BACKGROUND OF THE INVENTION

The present invention relates to a method of connecting a coil as mounted in an electric watch or clock.

DESCRIPTION OF THE PRIOR ART

One conventional method of mounting a coil consists in preparing a bobbin from which two terminal pins extend upright to connect the terminal portions of a coil, winding a lead wire on the bobbin using an automatic winder to form the coil, winding the terminal portions of the coil on the terminal pins, dipping them into solder, inserting the terminal pins into a printed-wiring board, and soldering the terminal pins to the board.

Another conventional method consists in bonding a printed-wiring board, which is used to connect a coil, to a bobbin, winding a lead wire on the bobbin using a winder to form the coil, and bonding the terminal portions of the coil to the printed-wiring board by thermal welding using a small-sized welding robot.

The first-mentioned prior art technique requires that two terminal pins for connecting the terminal portions be mounted on the bobbin so as to extend upright therefrom; however, this increases the number of components. Also, the connecting operation is laborious to perform.

In the second-mentioned prior art technique, when the lead wire is wound, the bobbin is connected with the printed-wiring board. Therefore, the function of the winder limits the size, shape, and so on of the printed-wiring board. Further, it is difficult to wind the lead wire.

Accordingly, it is the object of the present invention to provide a method which permits one to process the terminal portions of a coil easily and facilitates the wiring for an electric circuit.

SUMMARY OF THE INVENTION

The present invention is characterized in that (A) a coil consisting of windings of a lead wire is prepared, (B) the terminal portions of the coil are drawn in such a way that they traverse beyond a conductor to which the coil is to be connected, (C) the terminal portions are attached to anchoring portions placed close to the conductor, and (D) the lead wire traversing the conductor is connected with the conductor at the point of traverse.

BRIEF DESCRIPTION OF THE DRAWINGS

The figures show examples of the invention.

FIG. 3 is an enlarged cross section taken on line III—III of FIG. 1;

FIG. 4 is a plan view of another example of the invention; and

FIG. 5 is an enlarged cross section taken on line V—V of FIG. 4.

DESCRIPTION OF THE PREFERRED EMBODIMENTS

The present invention is next described with reference to the drawings.

Figure 1:
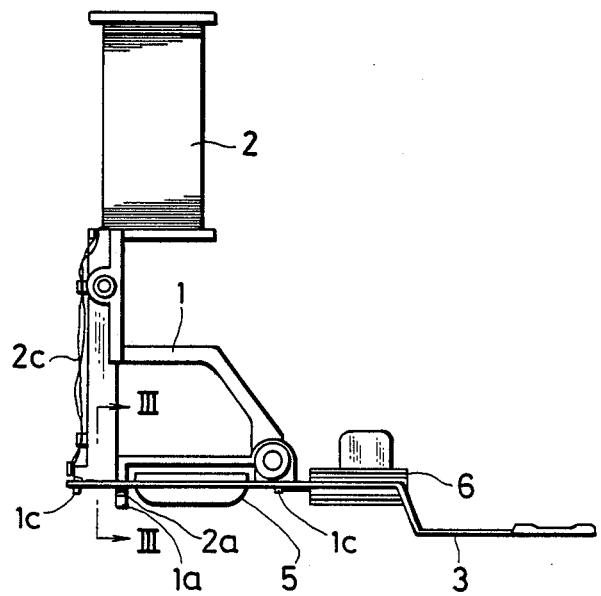
FIG. 1 is a plan view of one example of the invention, and in which a coil is connected.
Figure 2:
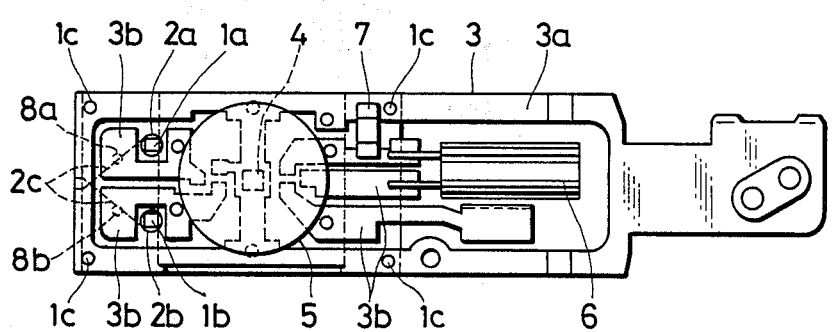
FIG. 2 is an enlarged front elevation of the example shown in FIG. 1.

Referring to FIGS. 1 and 2, a lead wire 2c is wound on a bobbin 1 to form a coil 2. The bobbin 1 is made from a synthetic resin, and has anchoring portions 1a and 1b. The terminal portions 2a and 2b of the coil 2 are wound on the anchoring portions 1a and 1b. These operations can be automated by supplying the bobbin 1 using a part feeder and an ordinary NC winder. In this example, a conductor 3 is a leadframe stamped from a conductive plate. The conductor 3 has interconnecting portions 3a each including a plurality of lead portions 3b to which an integrated circuit 4 is connected. These lead portions 3b are coated with bonding resin 5 so as to be held together. Also shown are a crystal oscillator 6 and a capacitor 7. Pins 1c to which the conductor 3 is attached are formed integrally with the bobbin 1. The conductor 3 is provided with holes into which the pins are fitted, and then the front end of each pin is struck to flatten it. Thus, the pins are connected to the conductor 3 so as not to be detachable. At the same time, the front ends of the anchoring portions 1a and 1b are flattened to prevent the terminal portions 2a and 2b from disengaging. The terminal portions 2a and 2b of the coil 2 are drawn so as to traverse the lead portions 3b of the conductor, and engage the anchoring portions 1a and 1b placed near the lead portions. Then, the lead wire 2c which passes over the lead portions 3b near the terminal portions 2a and 2b is connected to the lead portions 3b. The lead wire 2c has an outer coating of polyurethane. The coating is melted by applying heat, and the lead wire 2c is bonded to the conductor 3 by spot welding at locations 8a and 8b.

As shown in FIG. 3, the lead wire 2c crosses the conductor 3 on its way to the anchoring portions 1a and 1b. Electrode rods 9 and 10 are pressed against the overlapping lead wire and the conductor from above and below to bond them together by spot welding at the locations indicated 8a and 8b. The lead wire 2c can also be connected by soldering. In this case, the coating is melted by the heat produced by the soldering, and the lead wire 2c is bonded to the conductor 3.

FIGS. 4 and 5 show another example of the invention. A bobbin 11 has three anchoring portions 11a, 11b, 11c each of which has a claw at its front end. A coil 12 has terminal portions 12a and 12b which are brought out from the body of the coil and attached to the two anchoring portions 11a and 11b. A circuit-wiring board 14 is provided with holes 14a, 14b, 14c in which the anchoring portions 11a, 11b, 11c are engaged. Thus, the bobbin 11 is connected to the board 14. Conductors 13a and 13b forming a circuit pattern are formed on the board 14. The terminal portions 12a and 12b of the coil 12 are anchored to the anchoring portions 11a and 11b located near the conductors 13a and 13b. The lead wire 12c traverses the conductors 13a and 13b on its way to the anchoring portions 11a and 11b. The lead wire 12c passing over the conductors 13a and 13b is bonded to the conductors 13a and 13b by soldering at locations 18a and 18b.

As described above, in accordance with the invention, a lead wire is made to cross a conductor near the terminal portions of a coil. The wire is bonded to the conductor at the intersections. Therefore, they can be very easily bonded together by heat seal or soldering. The coil is formed by winding the lead wire before the coil is bonded to the conductor. This makes it easy to wind the lead wire. Also, no limitations are imposed on the shape or size of the conductor.

We claim:

1. A method of connecting a coil consisting of windings of a lead wire said windings forming terminal portions of the coil, said method comprising the steps of:

drawing the terminal portions of the coil in such a way that they traverse a conductor to which the coil is to be connected; attaching the terminal portions to anchoring portions placed near the conductor; and then connecting the lead wire to the conductor near the positions at which the terminal portions traverse the conductor.

2. The method of claim 1, wherein the lead wire is connected to the conductor by heat seal.

3. The method of claim 2, wherein the lead wire is connected to the conductor by soldering.

4. A method of connecting a coil to be mounted in an electric watch comprising:

preparing a coil consisting of windings of a lead wire and terminating in multiple terminal portions of that lead wire;

placing the terminal portions of the lead wire in such a way that each terminal portion traverses beyond separate conductors to which the coil is to be connected at a point of traverse;

anchoring the terminal portions to anchoring means for holding the terminal portions in a stretched position across said conductors; and, connecting each lead wire to the conductor at the point of traverse.

5. The method of claim 4, wherein the terminal portion of the lead wire is connected to the conductor by a heat seal.

6. The method of claim 5, wherein the terminal portion of the lead wire is connected to the conductor by solder.

7. A method of electrically connecting a coil for an electric watch, said coil consisting of multiple windings of a lead wire with the lead wire having terminal portions thereof, said method comprising the steps of:

extending the terminal portions of the lead wire away from the coil and beyond respective conductors to which said terminal portions are to be attached to thereby traverse said conductors at a point of traverse;

attaching the terminal portions to anchoring means for stretching said terminal portions over said conductors; and, connecting said terminal portions of said lead wires to said conductors at the point of traverse by the use of a seal.

* * * * *